United States Patent [19]
Mellitz et al.

[11] Patent Number: 6,078,965
[45] Date of Patent: Jun. 20, 2000

[54] TRANSMISSION LINE SYSTEM FOR PRINTED CIRCUITS

[75] Inventors: Richard I. Mellitz, Irmo; Roy M. Stevens, Lexington, both of S.C.

[73] Assignee: Intel Corporation, Santa Clara, Calif.

[21] Appl. No.: 08/986,968

[22] Filed: Dec. 8, 1997

[51] Int. Cl.[7] .................................................. G06F 3/00
[52] U.S. Cl. ........................... 710/1; 333/100; 333/101; 333/128
[58] Field of Search ................... 395/836, 835, 395/821, 822; 710/16, 15, 2, 1; 333/100, 128

[56] References Cited

U.S. PATENT DOCUMENTS

| | | | |
|---|---|---|---|
| 4,167,714 | 9/1979 | Flora | 333/101 |
| 4,360,741 | 11/1982 | Fitzsimmons et al. | 307/151 |
| 4,769,618 | 9/1988 | Parish et al. | 330/277 |
| 5,006,820 | 4/1991 | Prioste et al. | 333/33 |
| 5,012,213 | 4/1991 | Tsai | 333/247 |
| 5,323,359 | 6/1994 | Kayamoto et al. | 365/233.5 |
| 5,446,424 | 8/1995 | Pierro | 333/104 |
| 5,489,500 | 2/1996 | Andrejack et al. | 430/313 |
| 5,543,807 | 8/1996 | Stangel | 342/374 |
| 5,612,657 | 3/1997 | Kledzik | 333/247 |

*Primary Examiner*—Meng-Ai T. An
*Assistant Examiner*—Mackly Monestime
*Attorney, Agent, or Firm*—Blakely, Sokoloff, Taylor & Zafman LLP

[57] ABSTRACT

A branched transmission line, used for delivering control signals to integrated memory circuits. Memory circuits require control signals, which are delivered on control lines. If multiple memory circuits are involved, multiple control lines are used. If the multiple control lines branch from a common branch point on a supply line, undesirable reflections can occur. The invention reduces the reflections, by distributing the branching, as by starting with three initial branches, each of which branches into three other branches, in order to feed nine memory circuits.

14 Claims, 19 Drawing Sheets

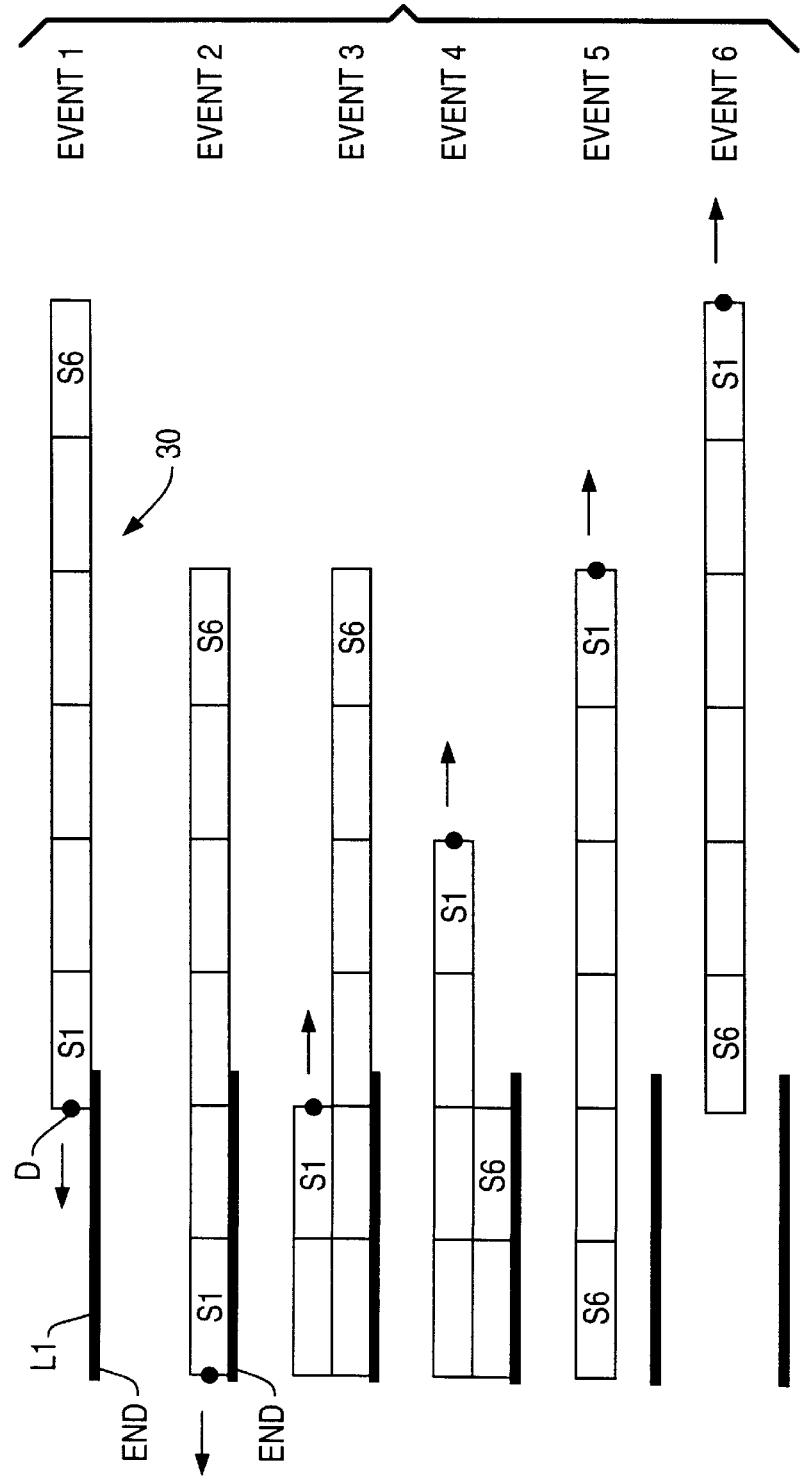

STEP

W (FIG. 2)

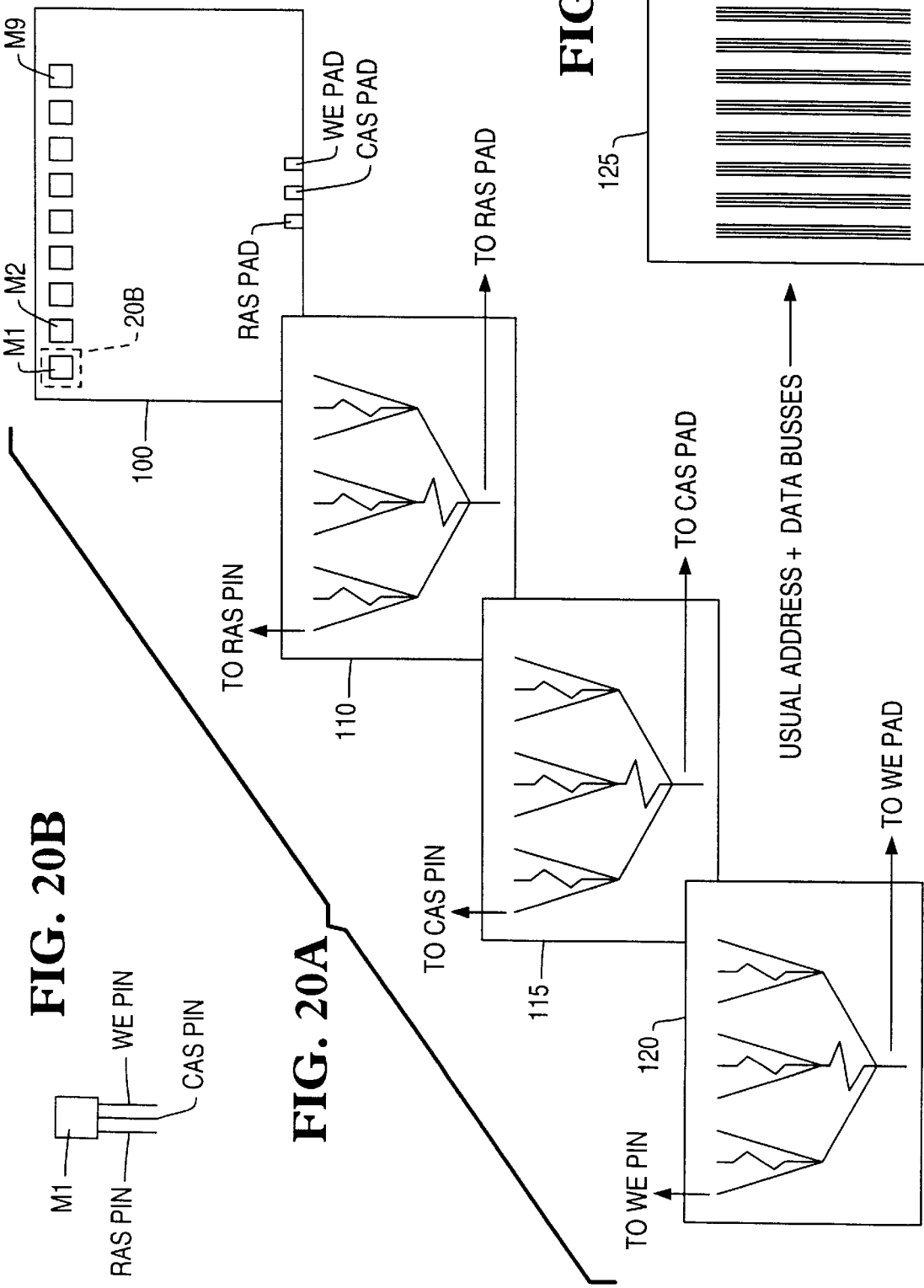

6,078,965

TRANSMISSION LINE SYSTEM FOR PRINTED CIRCUITS

The invention concerns a geometry for transmission lines on a printed circuit board, which reduces distortion in signals delivered to integrated circuits attached to the printed circuit board.

BACKGROUND OF THE INVENTION

Dual In-line Memory Modules, DIMMs, are high-density printed circuit boards used for memory expansion in computers. They frequently contain other integrated circuits, which, in turn, contain the integrated circuits used for memory. FIG. 1 illustrates schematically one DIMM and eight memory circuits, M1–M8, which are attached to the DIMM. Also shown is a Row Address Select line, or RAS line. Other control lines, and busses, are not shown.

The Inventor has found that, when an ordinary signal is applied to the RAS line, the waveform found at points such as P in FIG. 1 can resemble waveform W shown in FIGS. 2A and 2B. In that waveform, inflection points IP_1 and IP_2 occur. The first inflection point IP_1 is preceded by the indicated DROP_1 in voltage, and is followed by the indicated RISE to the second inflection point IP_2, which is followed by another DROP_2.

These inflection points are undesirable, chiefly because they occur within the neutral, or undefined, zone of the input signal, as indicated. The neutral zone lies between thresholds TR_1 and TR_2. A signal above threshold TR_1 is defined as a logic HIGH signal. A signal below threshold TR_2 is defined as a logic LOW signal. If the inflection point occurred above the HIGH threshold TR_1, or below the LOW threshold TR_2, it could perhaps be tolerated.

However, when the input signal lies within the neutral zone, the input circuitry of each memory modules M is held, at that time, in a meta-stable state, which is not perfectly stable. Slight aberrations in the input signal can cause erratic behavior in the memory modules. In small computer systems, the erratic behavior does not occur frequently and is thus, in general, not serious. A hypothetical, but realistic, example will illustrate the frequency of errors, and why they are considered as not serious.

Assume an error probability of $0.003 \times 0.125 \times 10^{-7}$ memory-cell-failures/day. (The "0.003" and the "0.125" were chosen to make computation simple, as will be seen.) Assume a computer having a memory of 10 Mega-Bytes, MB, which equals $10^7$ bytes, or $10^7 \times 8$ bits.

The failure rate of a system on any given day is the product of (1) the error probability and (2) the number of memory cells. (Each cell counts as one bit.) In this example, the probability is:

$$(0.003 \times 0.125 \times 10^{-7} \text{ memory-cell-failures/day}) \times (10^7 \times 8 \text{ cells}) = 0.003$$

This failure rate means that, every 1,000 days, a memory cell, or bit, will fail on three days. If that memory cell is storing data which is needed by a program, a data error will probably occur.

This failure rate is about once per year, which, in many cases, is acceptable. To place this failure rate into perspective: failures due to surges in electrical power, or electrical storms, occur more frequently, and are still tolerated.

However, for larger systems, having larger amounts of memory, the failure rate increases proportionately. For example, assume the same error probability as above, but assume four other, larger systems, having 100 MB, 1,000 MB, 10,000 MB, and 100,000 MB of memory. The failure rates becomes 10, 100, 1,000, and 10,000 times greater than that computed above, respectively. That is, the failure rates become 0.03, 0.3, 3.0 and 30.0 failures per day, respectively.

Plainly, a rate of 30.0 failures per day, or more than one failure per hour, is not acceptable in many situations.

Therefore, extremely small error probabilities can cause unacceptable failure rates in computers having large amounts of memory. Large-scale DIMM systems are believed to contain transmission lines which generate the inflection points shown in FIGS. 2A and 2B. These inflection points may increase error probabilities.

OBJECTS OF THE INVENTION

An object of the invention is to provide an improved transmission line for integrated circuits.

A further object of the invention is to provide an improved memory expansion module for computers.

A further object of the invention is to provide a more reliable computer.

SUMMARY OF THE INVENTION

In one form of the invention, control lines for delivering control signals to multiple integrated circuits are branched more than once, so that a trunk line branches into several branch lines, which themselves branch into delivery lines which deliver the control signals to the integrated circuits.

BRIEF DESCRIPTION OF THE DRAWINGS

FIGS. 18–20 illustrate alternate embodiments.

DETAILED DESCRIPTION OF THE INVENTION

Figure 2A:
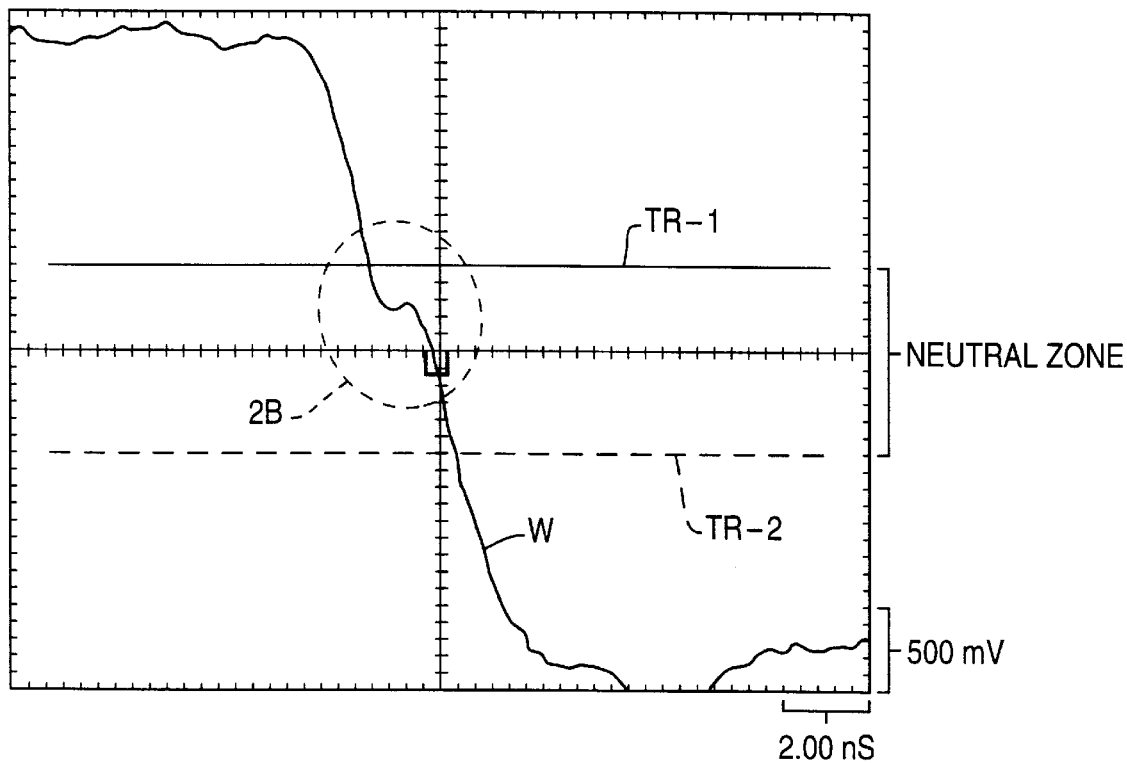
FIGS. 2A and 2B illustrate a waveform W which is received at points P in FIG. 1, in response to the RAS pulse.
Figure 2B:
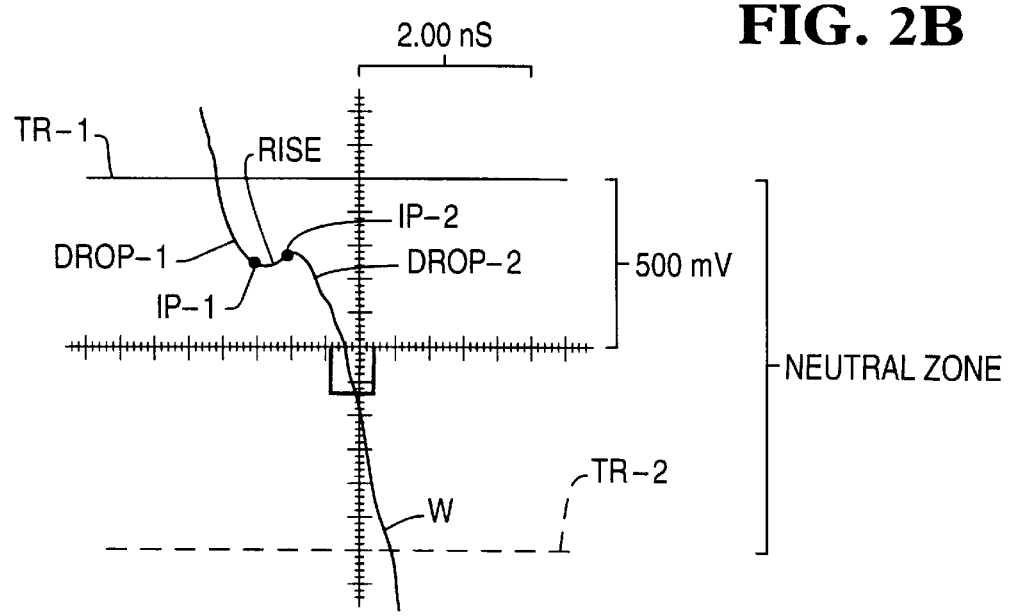

A possible cause of the inflection points IP in FIGS. 2A and 2B will be proposed. Travel of a signal pulse on a short transmission line will be illustrated, followed by illustration of the same signal travelling on a long transmission line.

Figure 3A:
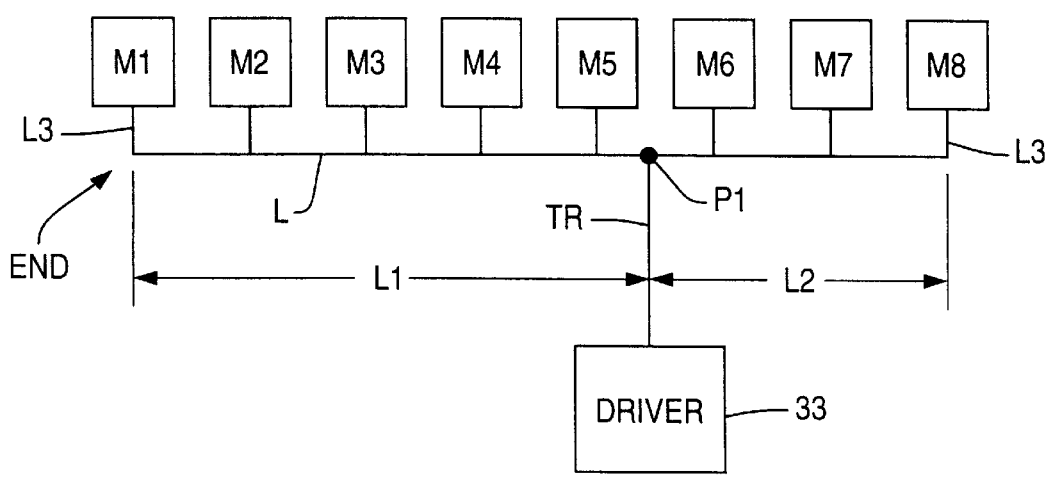
FIGS. 3 and 4 illustrate a long wave 30 being reflected on a short line L1.

FIG. 3A shows a common topology used to apply RAS signals to printed-circuit modules M1–M8. A driver 33 delivers signals on a trunk TR, which joins a long line L at a point P1. Point P1 divides the long line L into two sections, L1 and L2. Short lines L3 connect each module M1–M8 to a respective section L1 or L2.

The signal produced by the driver 33 can be represented by the long square wave 30 in FIG. 3B, which is shown entering the line L1. For ease of illustration, the wave 30 is divided into sections S1–S6.

FIG. 3B shows a sequence of six events. In EVENT 1, the wave 30 enters the line L1. The dot D indicates the wave front. In EVENT 2, the wave reaches the END of the line L1. The END is also shown in FIG. 3A. Reflection occurs at the END.

In EVENT 3, the reflected wave has progressed, and is returning to the driver 33 (not shown in EVENT 3). In EVENT 4, further reflection and progression have occurred. In EVENT 5, the wave 30 has been completely reflected, and in EVENT 6, the wave 30 has almost completely exited line L1.

Figure 4:
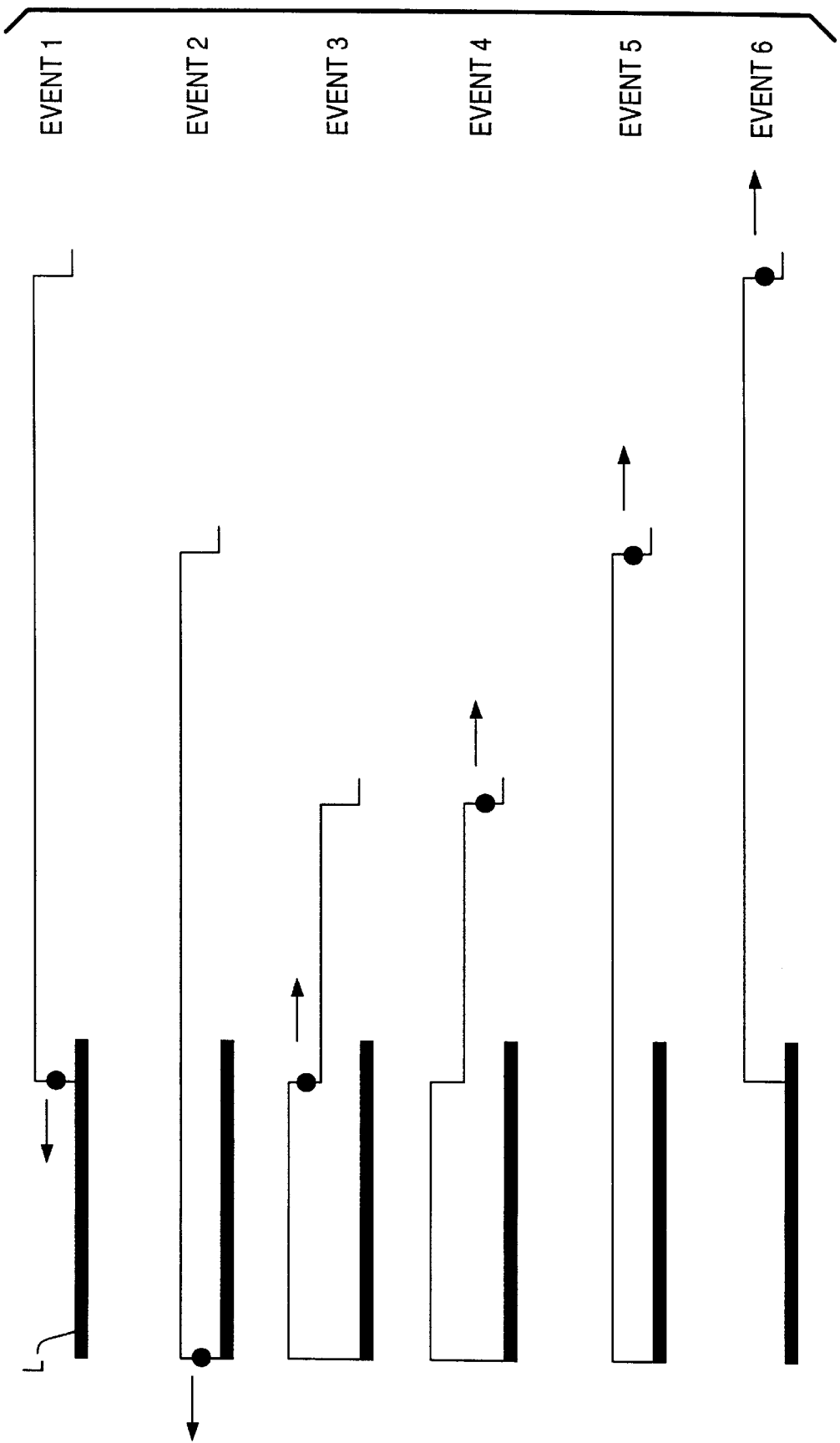

FIG. 3B is a schematic illustration. The actual voltage which would be measured along line L1 is shown in FIG. 4. The EVENTs shown correspond to those in FIG. 3.

Figure 5:
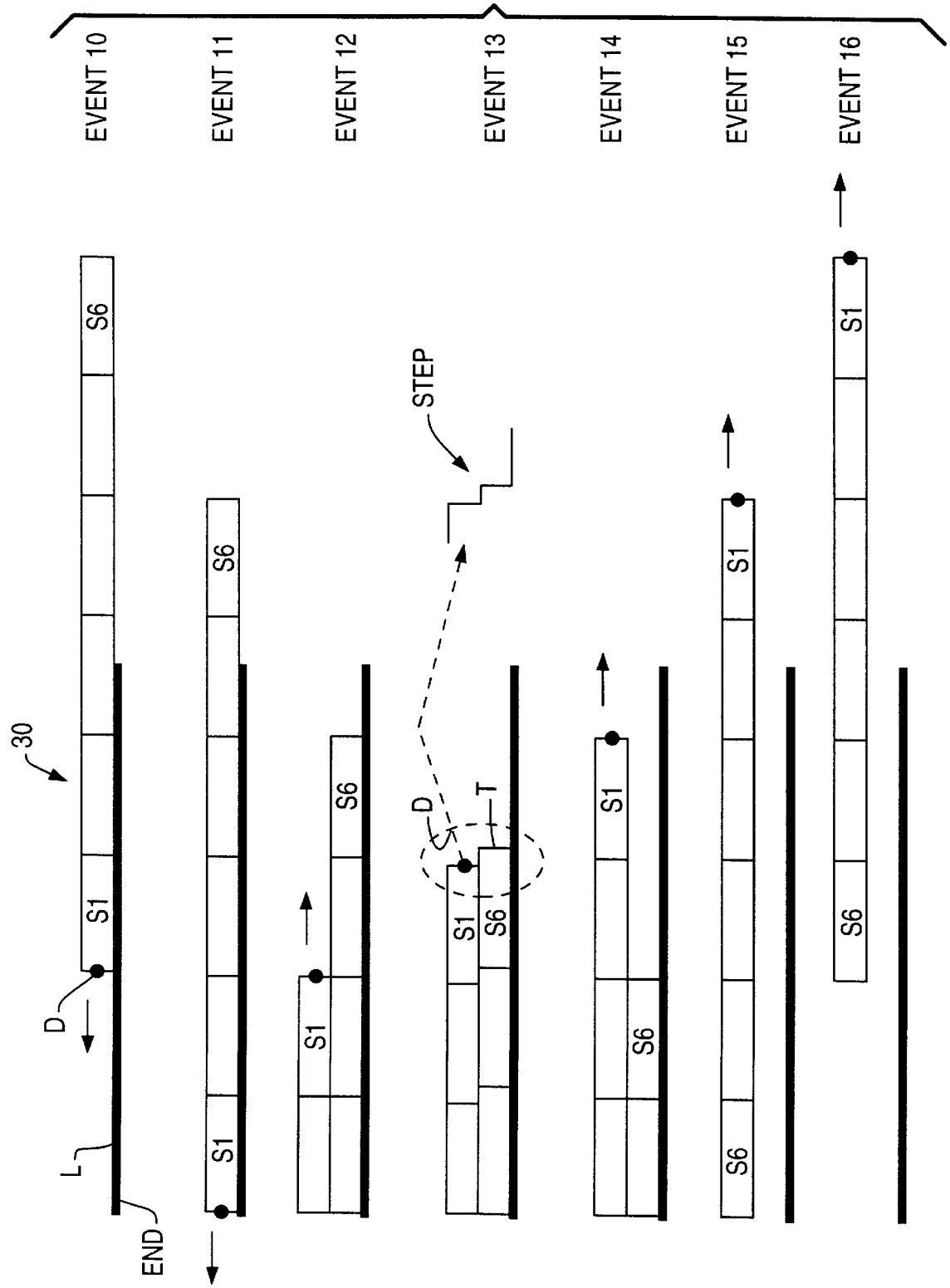
FIG. 5 illustrate a short wave 30 being reflected on a long line L1.

FIGS. 3B and 4 show a line L1 which is relatively short, with respect to the wave 30. If line L1 is made relatively long, with respect to the wave 30, a different situation occurs, as shown in FIG. 5, which shows seven EVENTs, numbered 10 through 16. The overall situation is very similar to that of FIG. 3, with one exception, namely, that of EVENT 13, which depicts an instant occurring between EVENTs 12 and 14. In EVENT 13, the wavefront, indicated by the dot D, meets the trailing edge T of the wave 30, while both are present on line L1, thereby creating a STEP. This voltage STEP exists on line L1.

Figure 6:
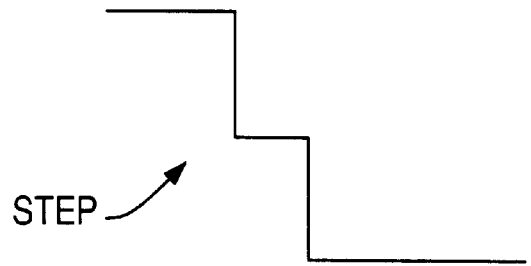
FIG. 6 illustrates how inductances and capacitances of a transmission line can transform the ideal STEP of FIG. 5 into the inflection points IP of FIGS. 2A and 2B.
Figure 6:
Figure 6:
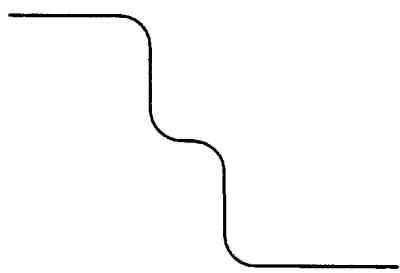
Figure 6:
Figure 6:
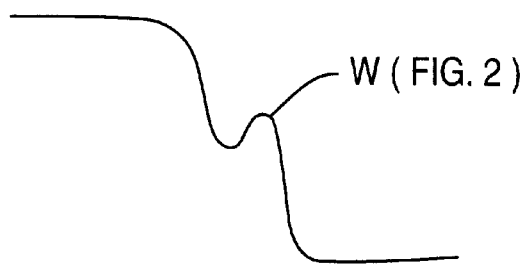

FIG. 5 illustrates an idealized STEP, having straight edges, which are either horizontal or vertical. However, actual transmission lines contains inductances and capacitances, which cause the step actually produced to deviate from the ideal STEP shown. Computer simulations of the events shown in FIG. 5 have shown that the STEP which actually occurs, in certain situations, will contain the dual inflection points IP__1 and IP__2 of FIG. 2B. FIG. 6 is a graphical representation illustrating how rounding of the corners of the STEP in FIG. 5 can produce the waveform W of FIGS. 2A and 2B.

The Inventor points out that no STEP of the type shown in FIG. 5 occurs in the prior-art system of FIG. 3B. One reason is that the wavefront, indicated by the dot D in FIG. 3B, exits the line L1 in FIG. 3A before the trailing edge TE enters.

Restated, the overall wave 30 can be viewed as making a "U-turn" on the line L1. But, in the prior-art device, the line L1 is not long enough for both the leading edge D and the trailing edge T to stand on the line at the same time. However, if the line L1 is made longer, as in FIG. 5, both the leading edge D and the trailing edge T can co-exist on the line L1 at the same time, as EVENT 13 indicates.

Therefore, the preceding discussion has illustrated that, as the ideal transmission line L1 in FIG. 3A becomes longer, the STEP of FIG. 5 can arise. In an actual longer transmission line, the STEP can contain the inflection points IP of FIG. 2B.

Modern high-density DIMMs, being larger physically than previous DIMMs, contain longer transmission lines. As a result, the STEPs of FIG. 5, and the inflection points of FIGS. 2A and 2B, may occur in modern DIMMs. Consequently, the longer transmission lines used in modern DIMMs may be one cause of the errors discussed in the Background of the Invention.

ONE FORM OF INVENTION

Definition

Figure 7:
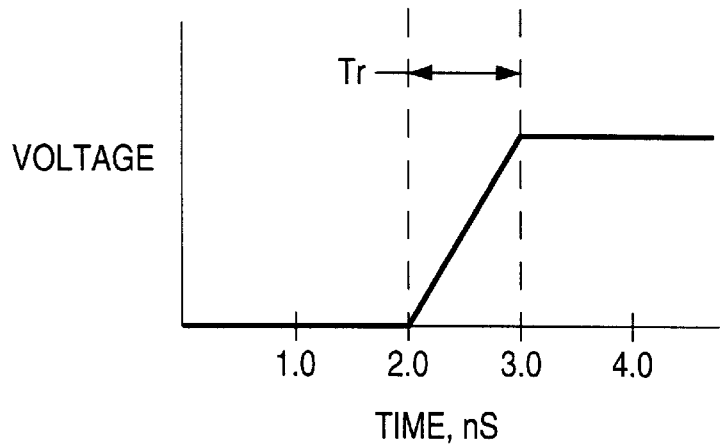
FIG. 7 illustrates a rising edge of a pulse.

A definition will first be introduced. FIG. 7 illustrates the rising edge RE of a waveform. The "transition wavelength" TE is defined as the physical length (in units of distance) of the rising edge RE, multiplied by a constant of proportionality, which may be unity. Quantitatively, the transition wavelength, TE, is defined as $$TE = Tr \times Vp \times K$$

wherein

Tr is the rise time of RE,

Vp is the propagation velocity, and

K is a constant of proportionality, which is preferably about 3.

As a specific example, consider a rise time of 1 nanosecond, nS. A rough approximation for propagation velocity in conductive traces in printed circuit boards is 0.5 feet per nano-second. Thus, applying the equation given above, the transition wavelength is about 1×0.5×3, or about 1.5 feet.

A similar definition applies to a falling edge, which is not shown.

ONE FORM OF INVENTION

Figure 8:
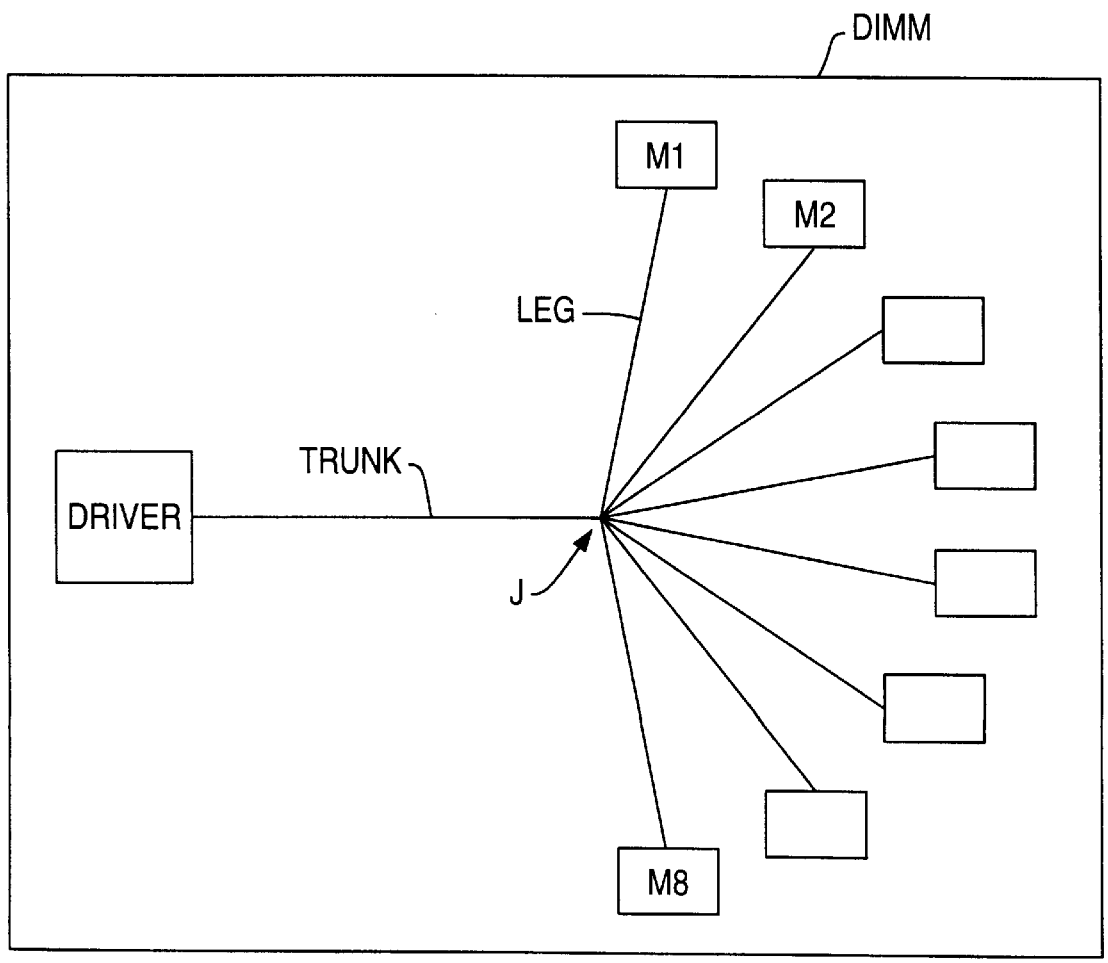
FIG. 8 illustrates one form of the invention.

In one form of the invention, a star-topology is used, as shown in FIG. 8. The modules M1–M8 are carried by a DIMM, of the type shown in FIG. 1. A TRUNK feeds eight LEGs, as indicated. The legs are all equal in length.

In simulations undertaken by the Inventor, the lengths of the LEGs were such that the round-trip time-of-flight of a wavefront from junction J to a module M, and then back to junction J, equals 1.0 nS. (Consequently, the length of a LEG is about 0.25 foot.) In the simulations, the DRIVER delivers to the TRUNK a waveform having a rise time of 1.0 nS.

At junction J, much of this waveform is reflected back to the DRIVER, so that only about 20 percent of this waveform reaches any LEG. This 20-percent initial transmitted waveform, is labeled IN in FIG. 9. This 20-percent waveform travels along the LEG, is reflected by a module M, and then returns to junction J, where it is re-reflected to the module M again. A detailed explanation of this type of reflection is given in the section entitled "Technical Considerations."

Figure 9:
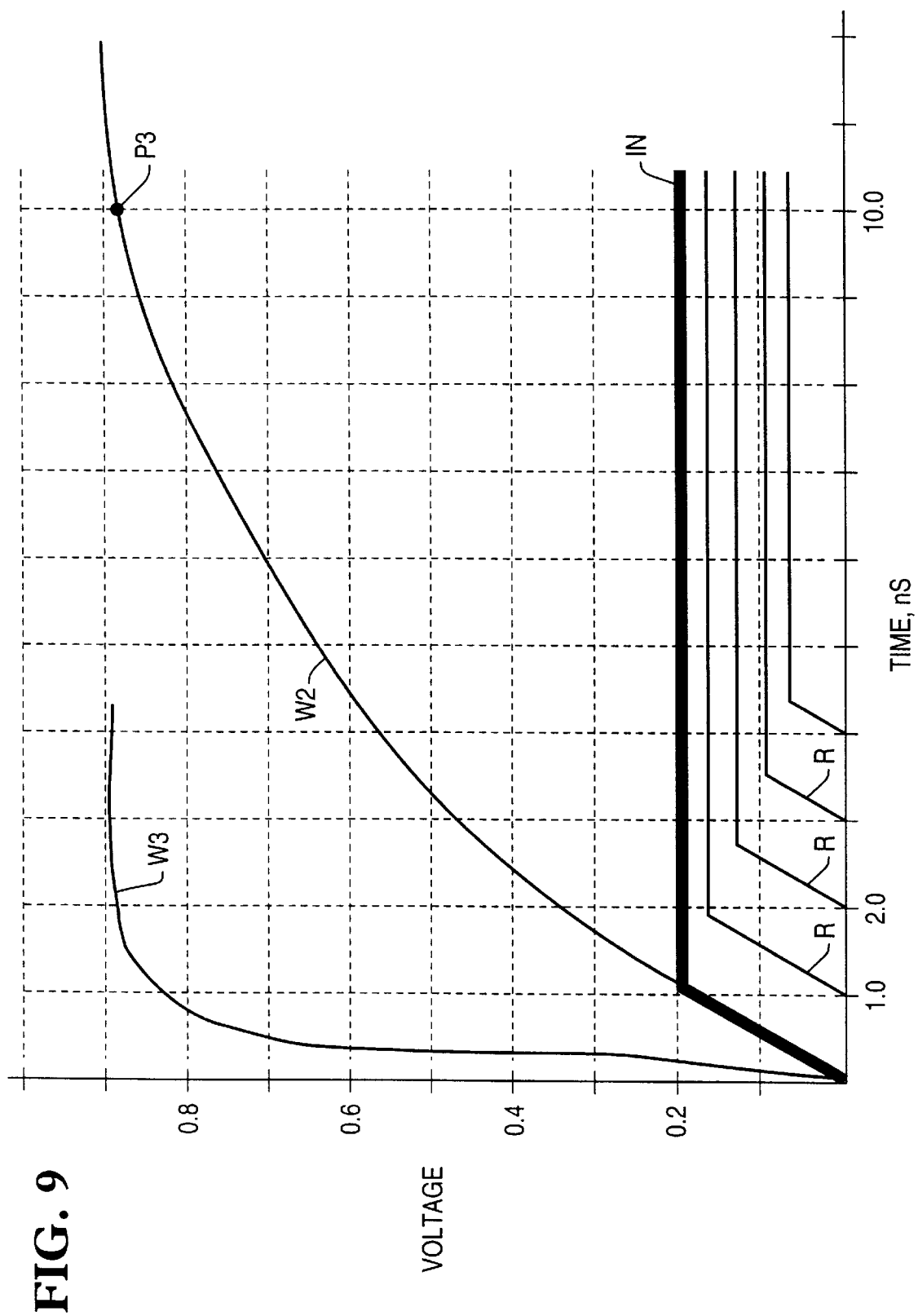
FIG. 9 illustrates rise time for devices of the type shown in FIG. 8

These reflections, which are labeled R in FIG. 9, progressively add, and form the exponential-type waveform W2 on the LEG. As FIG. 9 shows, about 10 nano-seconds are required for the waveform W2 to reach its final value, at point P3.

Other simulations were undertaken in the pursuit of reducing this rise time. It has been found that, if each LEG in FIG. 8 is shortened to ⅒ of the transition wavelength, then the overall rise time of the waveform becomes that of waveform W3 in FIG. 9.

Therefore, rise-time considerations militate in favor of short LEGs in FIG. 8. However, LEGs which are ⅒ the transition wavelength will be about 1.8 inches long: the transition wavelength for the rising edge in FIG. 7 is about 1.5 feet, as explained above, or 18 inches. One-tenth of 18 equals 1.8. Such short legs create manufacturing problems, especially if the number of modules M is large.

Figure 10:
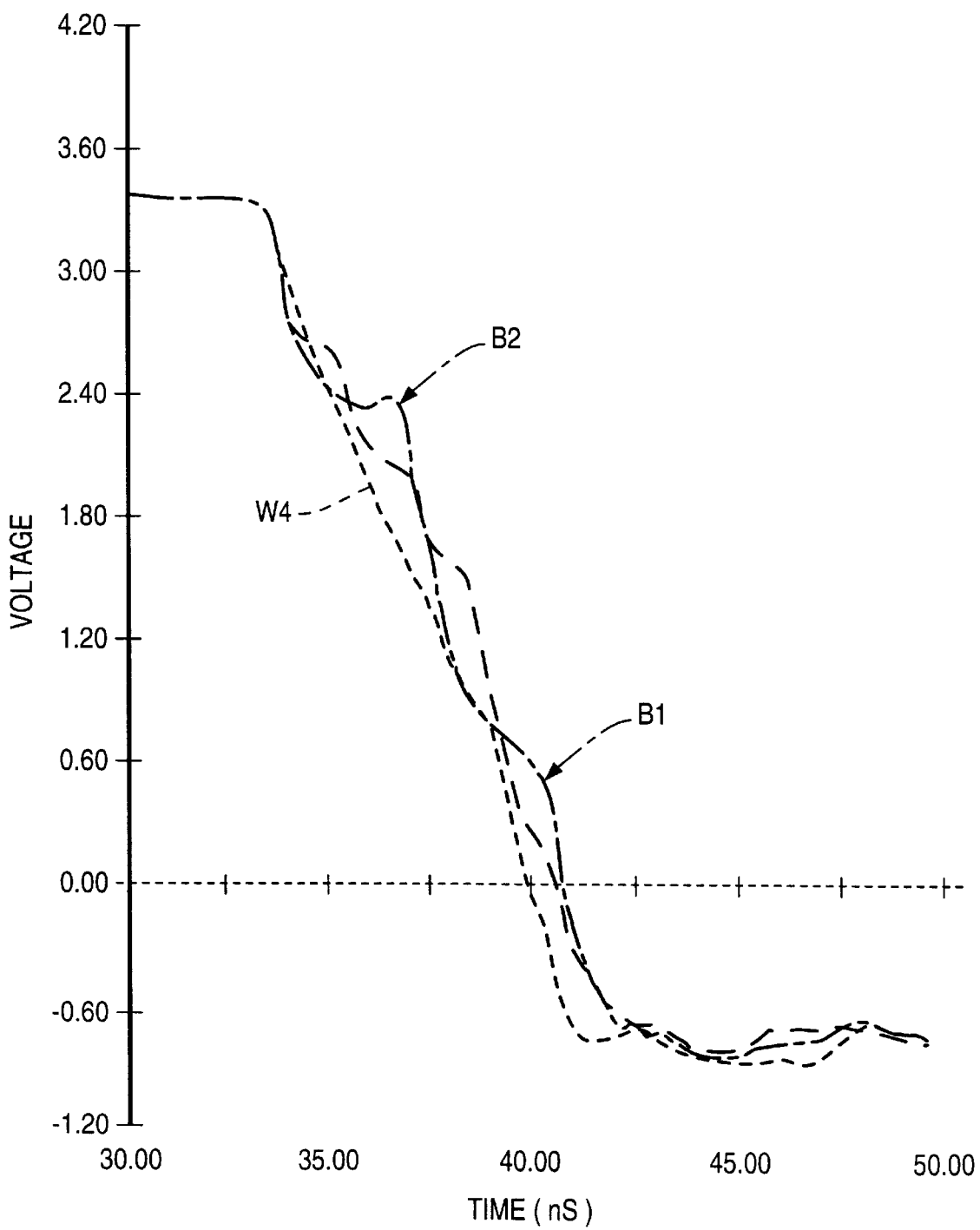
FIG. 10 illustrates simulated results for apparatus of the type shown in FIG. 8.

Further, independent of overall rise time, certain variations of the star-topology were found to produce inflection points of the type shown in FIGS. 2A and 2B. In one set of computer simulations, the LEG+TRUNK distance was held at 16 inches, which is about one transition wavelength. Under this constraint, three simulations were done for LEG lengths of one inch, three inches, and six inches, wherein the TRUNK lengths were, correspondingly, 15, 12, and 9 inches. FIG. 10 shows some of the results.

The one-inch LEGs produced plot W4, which is considered acceptable. However, the 3-inch and 6-inch LEGs produced bumps, such as B1 and B2, which are not considered acceptable.

Figure 12:
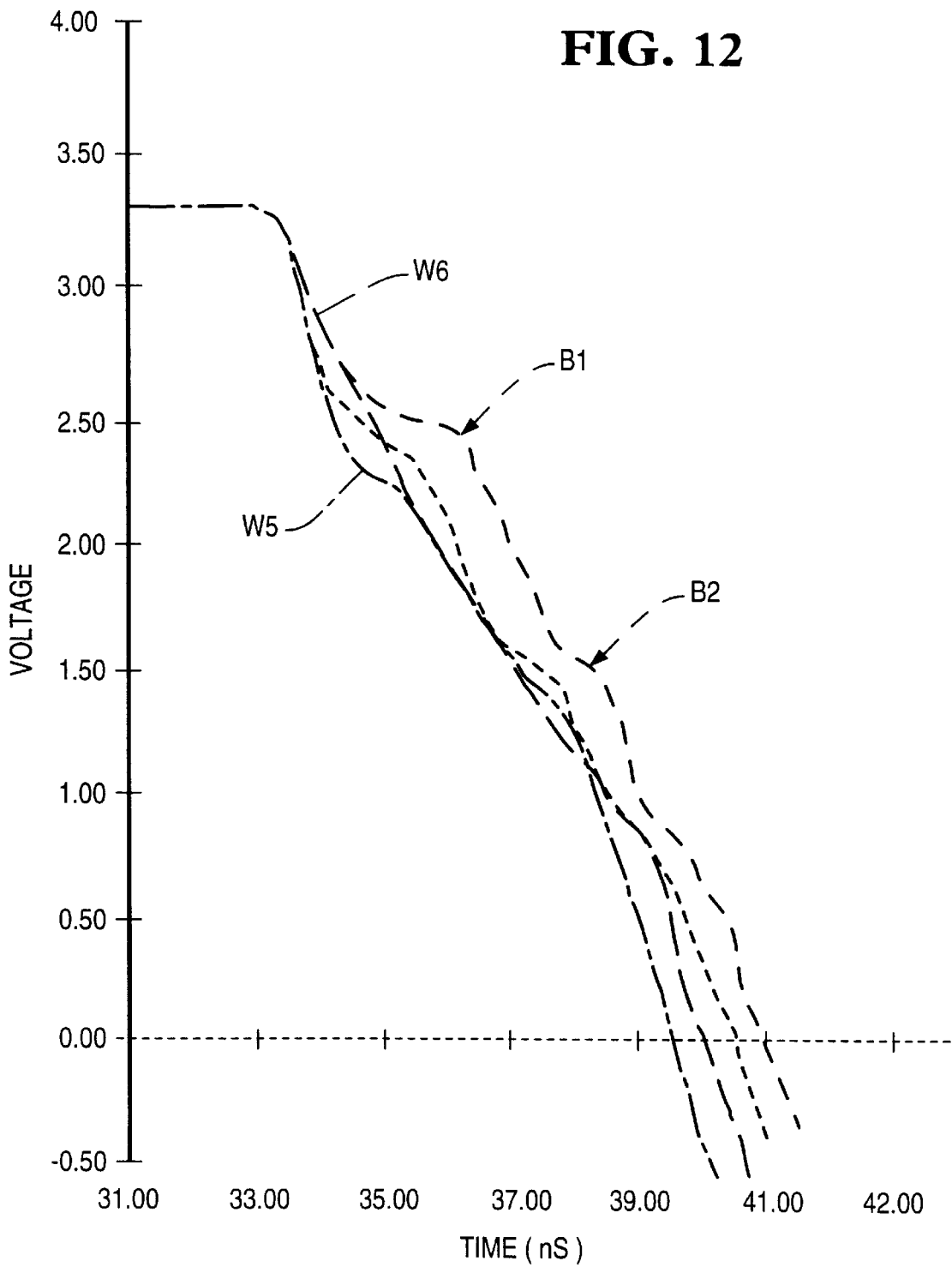
FIGS. 12 and 13 illustrates simulated results for apparatus of the type shown in FIGS. 8 and 11.

In a related simulation, the trunk was kept at one inch, and the legs were made long, at about one transition wavelength. This arrangement provided good rising and falling edges. Waveform W6 in FIG. 12 illustrates results for such a simulation, in which the TRUNK is 15 inches, and the LEGs are one inch. In FIG. 12, some other star topologies produced bumps B1 and B2.

Therefore, in one form of the invention, the star-topology of FIG. 8 is used for control lines, such as a RAS line, for a collection of memory modules M. Preferably, the LEGs are equal in length, at about 1/10 the transition wavelength of the waveform carried by the control line. Preferably, the TRUNK is about one transition wavelength long.

SECOND FORM OF INVENTION

Figure 11:
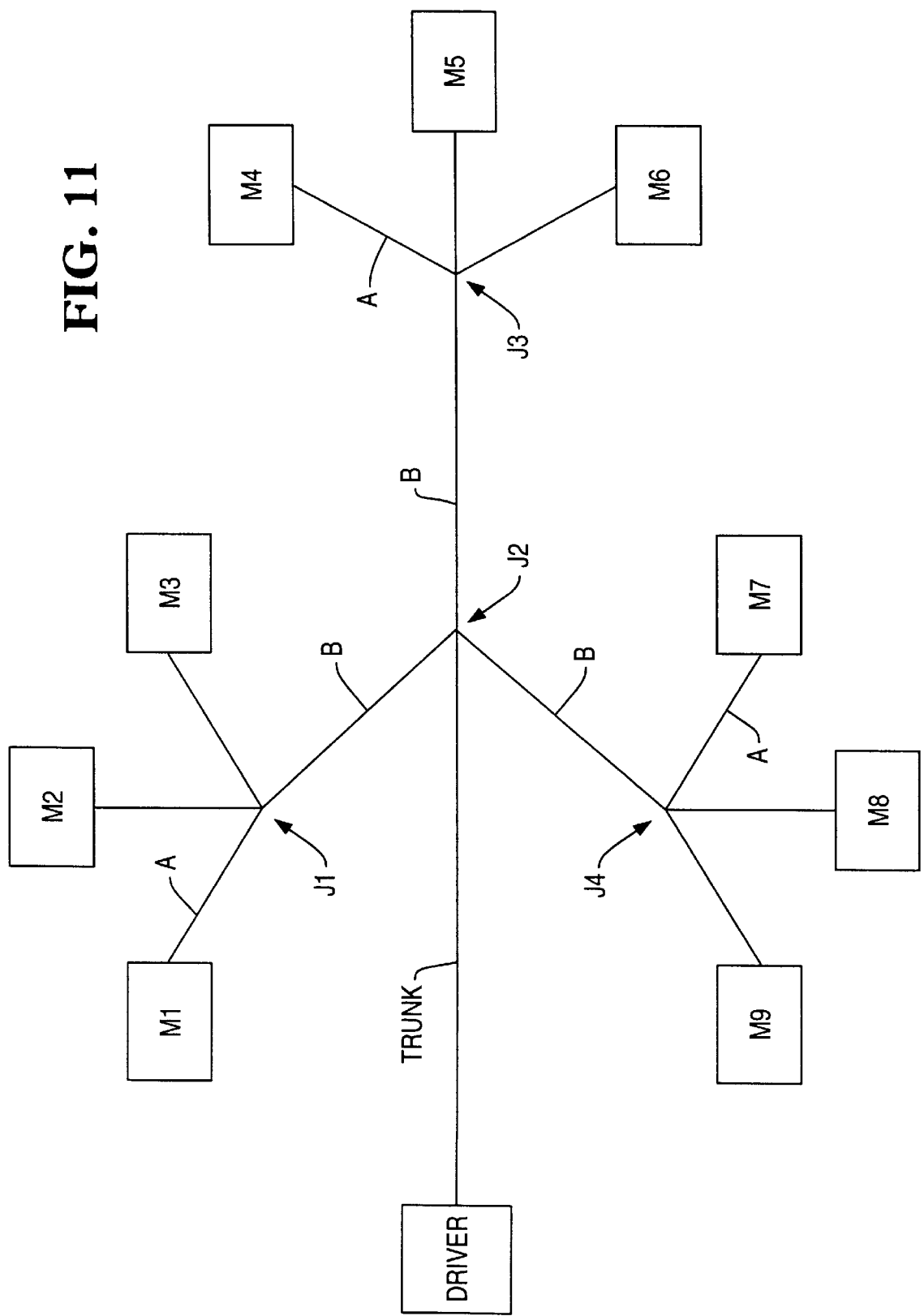
FIG. 11 illustrates another form of the invention.

In a second form of the invention, the "crow's foot" arrangement of FIG. 11 is used. A TRUNK branches into branches B at junction J2. Each branch B branches into further branches A at junctions J3.

The electrical lengths of lines A are equal. In general, this will be caused by identical physical lengths of the lines A.

Similarly, the electrical lengths of lines B are equal. In general, this will be caused by identical physical lengths of the lines B.

Figure 13:
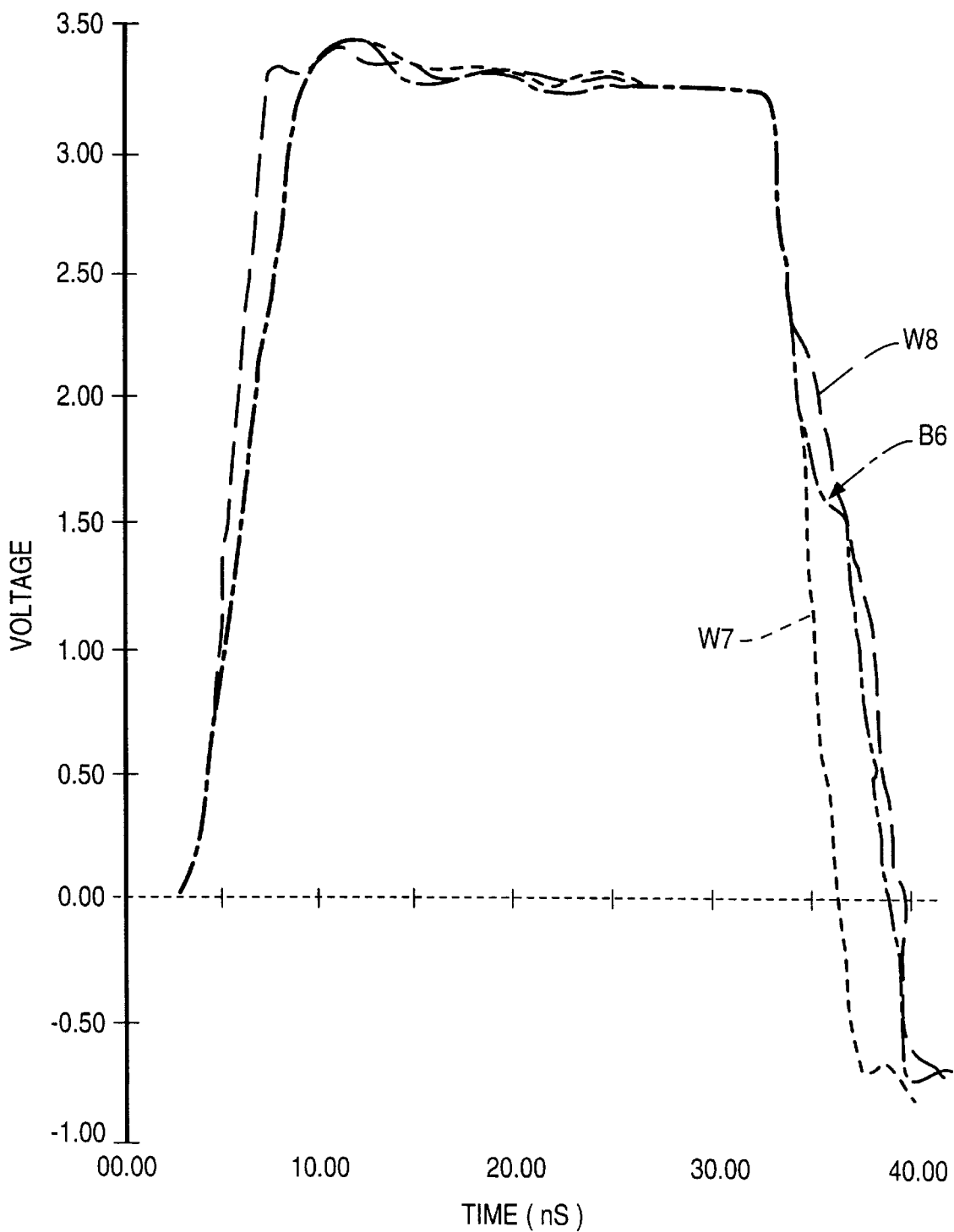

FIGS. 12 and 13 illustrate some simulated results. In FIG. 12, waveform W6 illustrates behavior of a crow's foot having (1) a TRUNK of 12 inches in length, (2) legs B of one inch in length, and (3) legs A of 3 inches in length. These dimensions represent one preferred embodiment. FIG. 13 illustrates this waveform at a different horizontal scale, and labeled W8.

For another crow's foot, simulation results are shown in FIG. 13. Waveform W7 illustrates behavior for (1) a TRUNK of 2 inches, (2) legs B of one inch, and (3) legs A of 13 inches. The behavior is good, but attaining these particular lengths may be difficult.

In FIG. 13, the bump B6 is created by a crow's foot having (1) a TRUNK of 8 inches, (2) legs B of one inch, and (3) legs A of 7. This bump B6 is considered unacceptable. Therefore, not all crow's foot configurations are suitable.

Based on the simulations described above, and others, the following rules have been developed.

For star-topologies, of the type shown in FIG. 8, the LEGs should equal less than 1/5 of a transition wavelength. For example, for a transition wavelength of 18 inches, the LEGs should be 3.5 inches, or less. On the other hand, if the TRUNK is less than 1/5 transition wavelength, then the LEGs should be greater than one transition wavelength.

For crow's foot topologies, as in FIG. 11, the A-legs (i.e., those connecting to the modules M) should be less than one transition wavelength. The B-legs (i.e., those between the A-legs and the TRUNK) should be less than ½ of a transition wavelength. Further, the TRUNK should not exceed ½ transition wavelength.

On one embodiment, the lengths of lines A and B in FIG. 11 are all identical, and each equals ¼ transition wavelength. As a specific example, lines A, B, and the TRUNK can all equal about 3.5 inches.

TECHNICAL CONSIDERATIONS

Discontinuities in Transmission Line

This discussion will set forth general principles of reflection in transmission lines.

Figure 14:
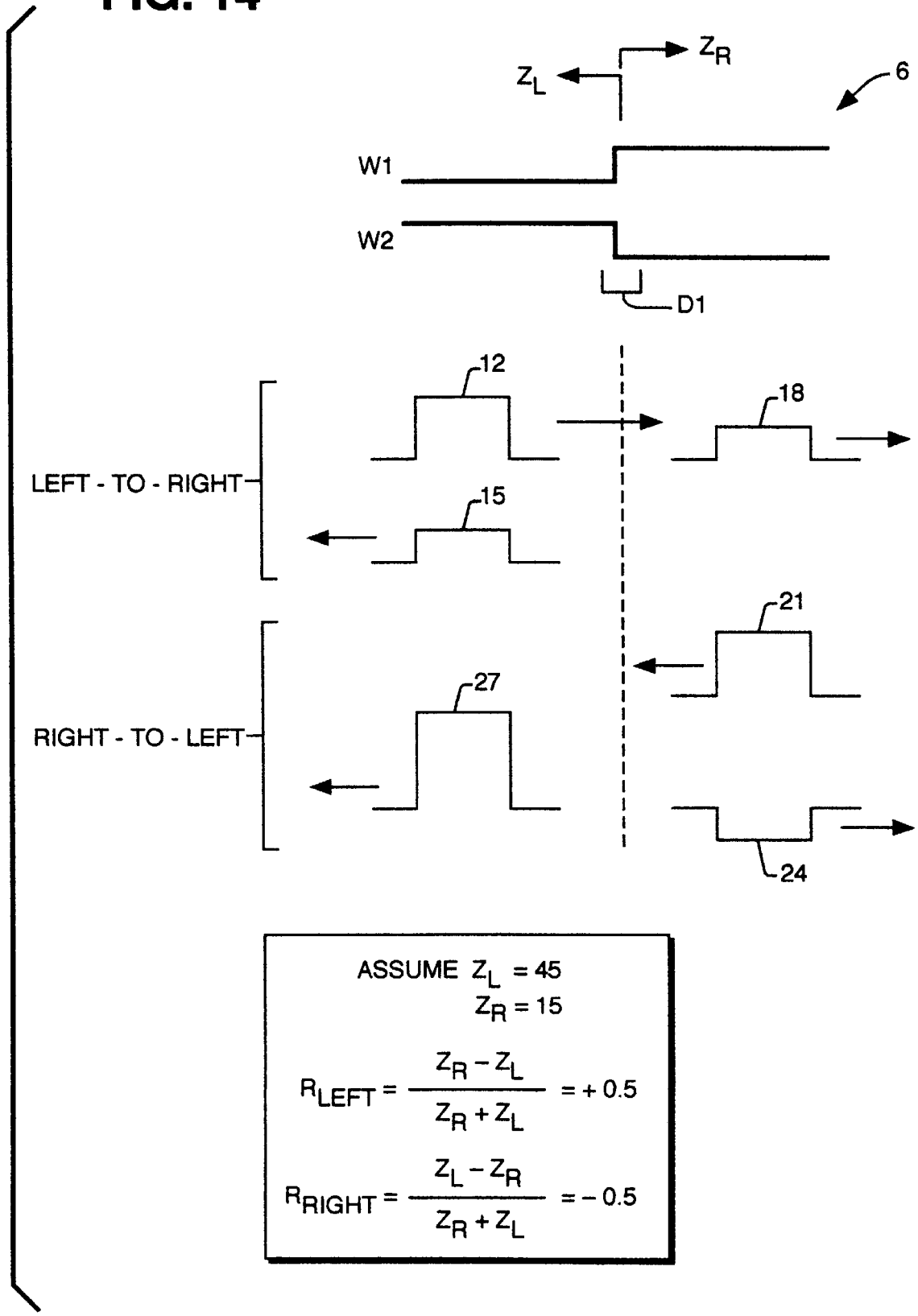
FIG. 14 illustrates reflection of a wave at a discontinuity D1.

FIG. 14, top, illustrates a discontinuity D1 in a transmission line 6 consisting of wires W1 and W2. In general, whenever a signal reaches the discontinuity D1, either from the right or the left, part of the signal is transmitted through the discontinuity, and part is reflected. A numerical example will illustrate the transmission and reflection.

Assume that the impedance of the transmission line 6, at the discontinuity D1, when looking to the left, is $Z_L$, as indicated, and, when looking to the right, is $Z_R$, as indicated. Assume that $Z_L$ equals 45 ohms, and that $Z_R$ equals 15 ohms, as indicated in the box at the bottom center of the Figure.

The reflection coefficient, $R_{left}$, at discontinuity D1 for a signal arriving from the left, is given by the following expression:

$$R_{left} = (Z_R - Z_L)/(Z_R + Z_L)$$

For the values assumed above, the value of $R_{left}$ is +0.5, a positive number.

Similarly, the reflection coefficient for a signal arriving from the right is $$R_{right} = (Z_L - Z_R)/(Z_R + Z_L)$$

For the values assumed above, the value of $R_{right}$ is −0.5, a negative number.

The difference between the two reflection coefficients depends on the order of subtraction within the numerator: the impedance of the line carrying the signal is subtracted from the impedance of the line which receives the signal. The numerators indicate the difference in impedances.

The magnitude of the difference does not depend upon the order of the subtraction, and is the same for both reflection coefficients. But the algebraic sign of the difference does depend upon the order.

Therefore, if the signal travels from a low-impedance line to a high-impedance line, the reflection coefficient is positive. As an extreme example, if the signal travels on an ordinary transmission line and encounters an infinite impedance, such as an open circuit, the reflection coefficient is positive unity.

Conversely, if the signal travels from a high-impedance line to a low-impedance line, the reflection coefficient is negative. As an extreme example, if the signal travels on an ordinary transmission line and encounters a zero-impedance, such as a short circuit, the reflection coefficient is negative unity.

In addition to reflection, part of the signal is transmitted through the discontinuity D. The voltage of the transmitted part, plus the voltage of the reflected part, must equal the voltage of the initial signal. FIG. 14 illustrates these concepts graphically.

The section labeled LEFT-TO-RIGHT illustrates an incoming signal 12, arriving from the left. Assume it is one volt in magnitude. It is split into a reflected positive signal 15, of magnitude 0.5 volts, and a transmitted positive signal 18, of magnitude 0.5 volts. The reflected signal 15 plus the transmitted signal 18 equal the incoming signal 12.

The section labeled RIGHT-TO-LEFT illustrates an incoming signal 21, arriving from the right. Assume it is one volt in magnitude. It is split into a reflected negative signal 24, of magnitude 0.5 volts, and a transmitted positive signal 27, of magnitude 1.5 volts. The reflected signal 24 plus the transmitted signal 27 equal the incoming signal 21.

ONE THEORY OF OPERATION

One theory of operation of the crow's foot embodiment will now be given. FIG. 15 illustrates junctions J1 and J2 of FIG. 11. In general, the input impedance of module M1 is not impedance-matched to branch A. In fact, the input impedance will be very high, with a small capacitive component. Consequently, reflections will occur at module M1.

Figure 15A:
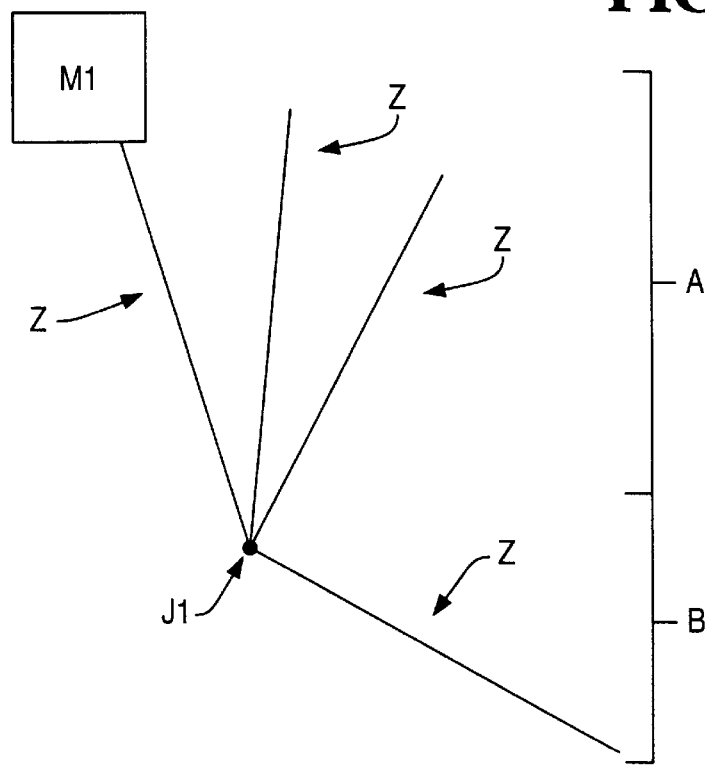
FIGS. 15A and 15B illustrate equivalent impedance Zeq seen by the line A connected to module M1.
Figure 15B:
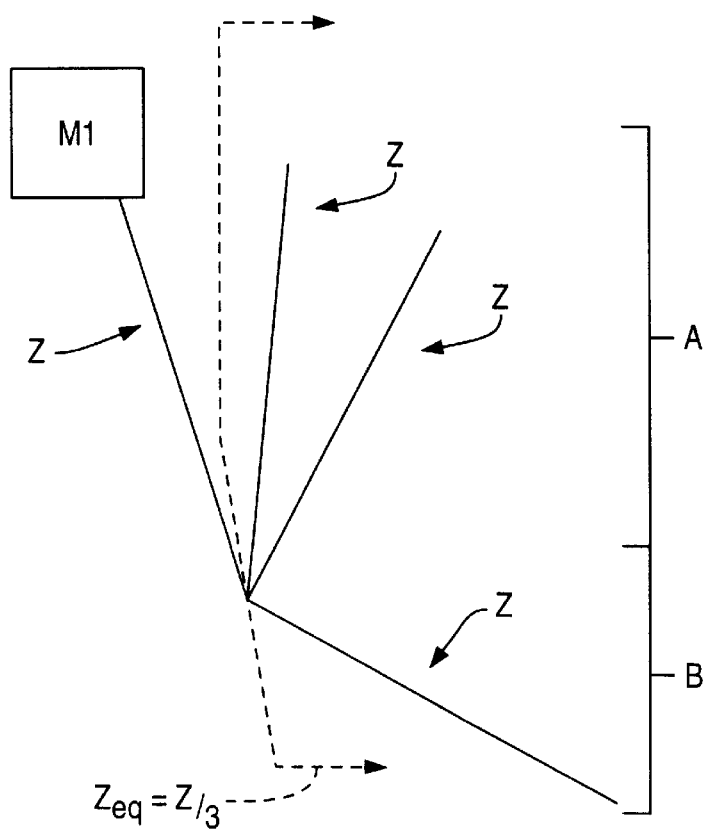

Consider a positive pulse reflected by module M1. When it reaches junction J1, it sees the parallel impedances of two "A" lines in FIG. 11, plus one "B" line, as illustrated in FIG. 15A. If the impedance of each "A" line, Z, equals that of the "B" line, then this parallel impedance equals Z/3, as indicated by the equivalent impedance Zeq in FIG. 15B. Applying the equations of FIG. 14, the reflection coefficient under these circumstances is negative ½.

Figure 1:
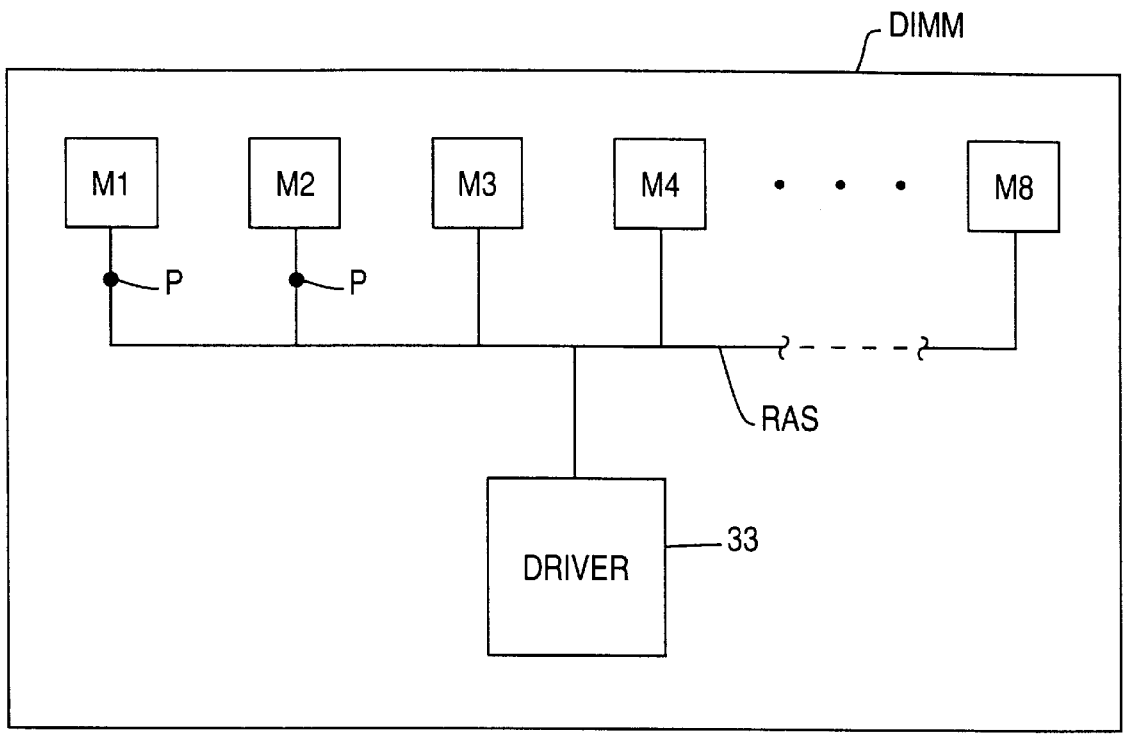
FIG. 1 illustrates a prior-art transmission line used in memory systems.

The reflection coefficient for junction J2 in FIG. 6 is computed in the same way, and also has the same value of negative ½, assuming the impedance of the TRUNK in FIG. 1 to also equal Z.

Figure 16:
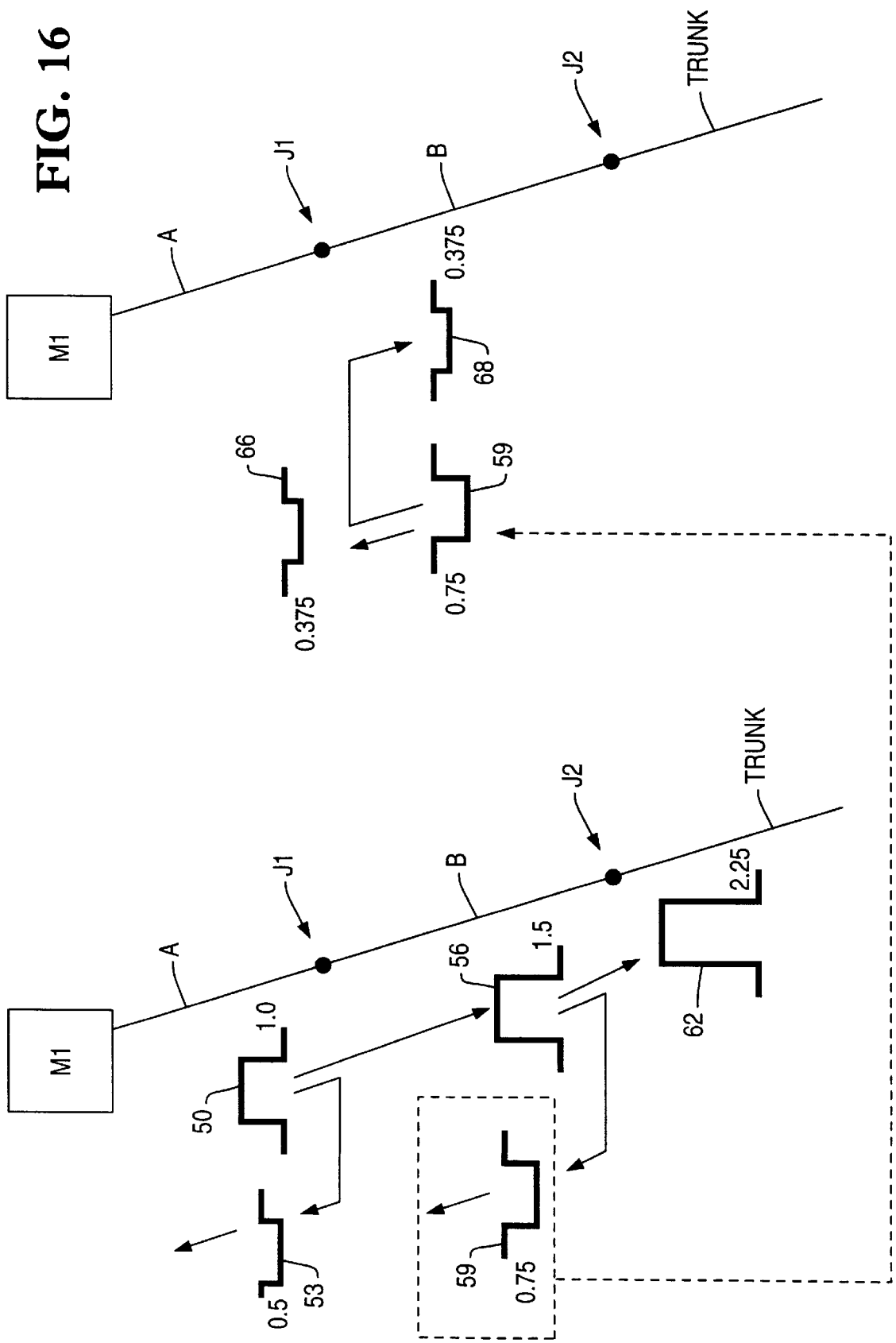
FIG. 16 illustrates a sequence of reflections.

FIG. 16 illustrates the reflections. Assume pulse 50 was reflected by module M1. The number "1.0" is the assumed magnitude of the pulse, namely, 1.0 volts. Pulse 50 is split into reflected pulse 53 and transmitted pulse 56, by junction J1.

At junction J2, pulse 56 is then split into reflected pulse 59 and transmitted pulse 62. Reflected pulse 59 travels back toward junction J1. As shown on the right side of the Figure, at junction J1, this reflected pulse 59 is split into a reflected pulse 68, which returns toward junction J2, and into a negative pulse 66, which travels toward module M1.

Figure 17:
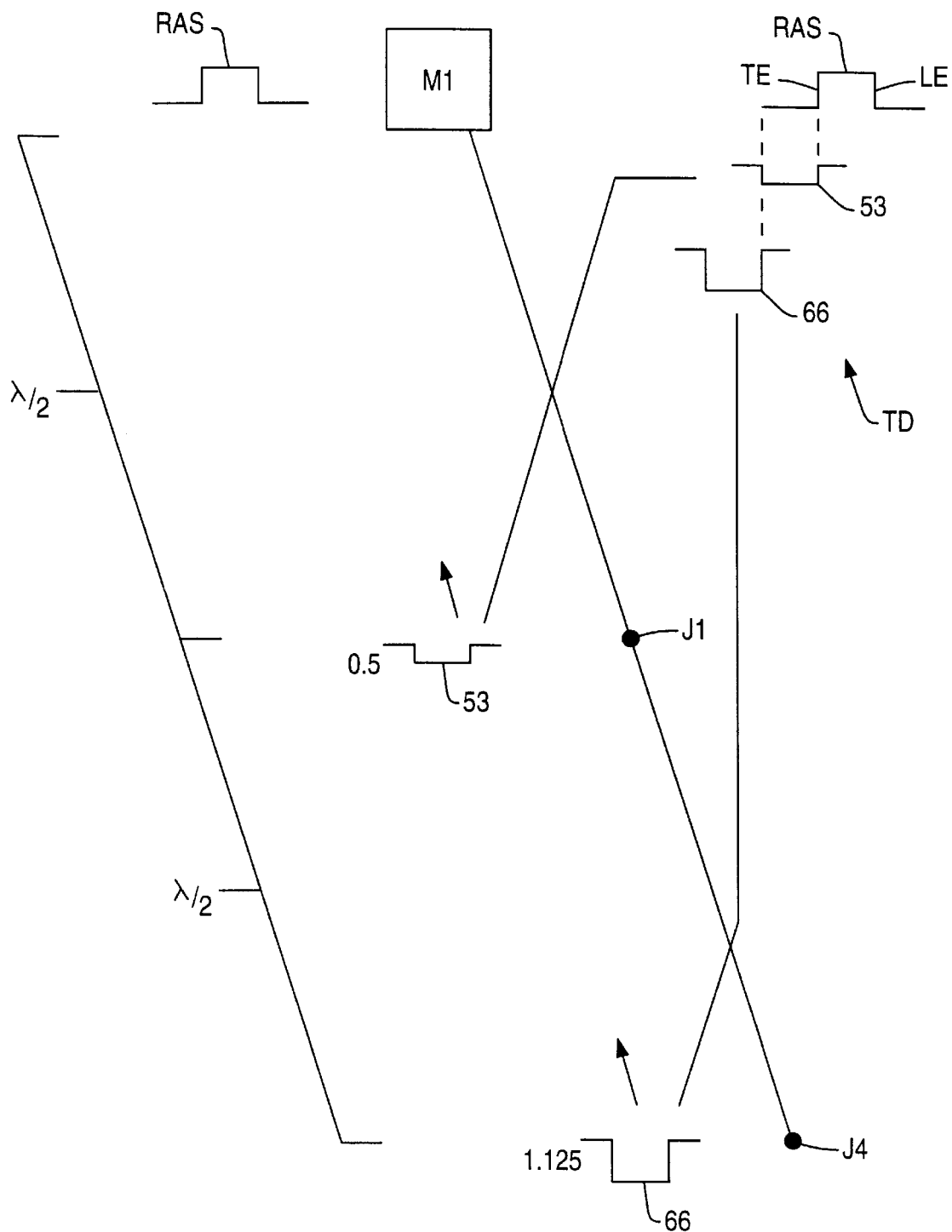
FIG. 17 illustrates an equivalent view of some of the reflections of FIG. 8. When the RAS pulse arrives at module M1, pulse 53 can be viewed as being launched one-half wavelength away, and pulse 66 can be viewed as being launched one wavelength away.

Therefore, as a result of the reflections just considered, two negative pulses are reflected toward module M1, namely, pulse 53 and pulse 66. FIG. 17 illustrates one rationale why these pulses are acceptable.

FIG. 17 illustrates the relative arrival times of the pulses at module M1. Recall that the distance from module M1 to junction J1 is ¼ wavelength. Consequently, the reflection of the RAS pulse occurring at module M1 (pulse 50 in FIG. 8) must travel ¼ wavelength from module M1 to reach junction J1. Next, the reflection of that reflection, (pulse 53 in FIG. 8) must travel another ¼ wavelength to return to module M1. The round-trip distance is ½ wavelength.

Thus, in FIG. 17, at the instant when the RAS pulse reaches module M1, negative pulse 53, in effect, begins travel at a junction J1, located ½ wavelength, or lambda/2, away. Similar reasoning applies to pulse 66, at junction J4, which is a full wavelength away.

Therefore, as timing diagram TD shows, pulse 53 arrives one-half wavelength after the leading edge LE of the RAS pulse arrives. Pulse 66 arrives ½ wavelength after this. With these arrival times, wherein the reflected pulses arrive after the leading edge LE terminates, the pulses 53 and 66 do not interfere with the leading edge LE.

Experimental Results

Commercially available memory expansion cards were obtained. Each card contained 256 Mega-bytes, MB, of memory, distributed among eight integrated circuits of 32 MB each, each analogous to a module M in FIG. 1. Twenty such cards were installed into a micro-computer, thereby providing a total expanded memory of 4 Giga-bytes.

This computer was run continually, using an exercise program. It was found that, every day, one or two error-correction code hits, or ECC hits, were obtained, indicating one, or two, data errors occurring during that day.

Figure 18:
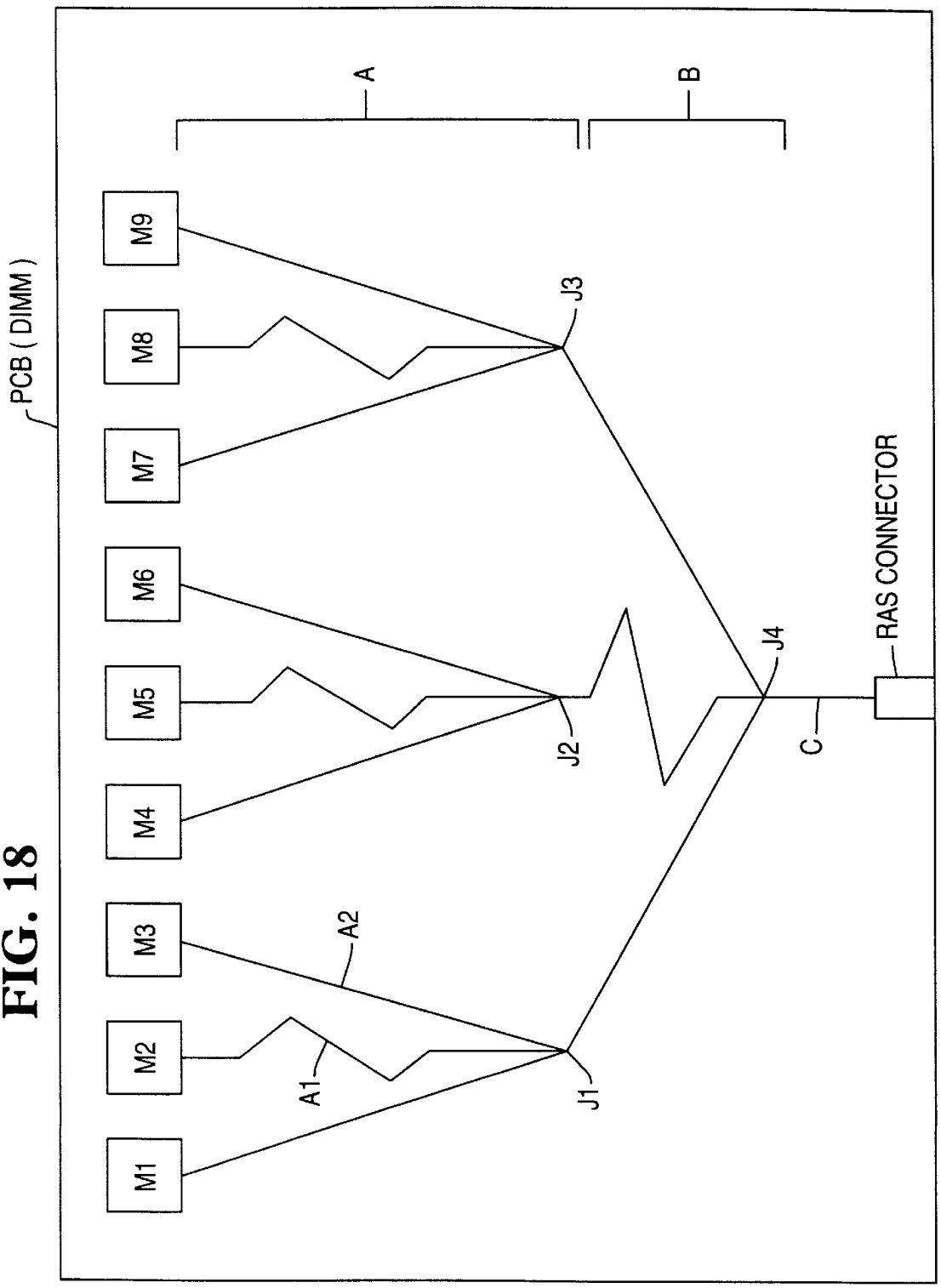

The expansion cards were replaced by cards having the branched control lines shown in FIG. 11 and also in FIG. 18. Otherwise, the cards were the same. The cards were still 256 MB in size, and twenty of them were used. Zero unexplained ECC hits per day were obtained. "Unexplained" means that some ECC hits were found, but these were identified as being caused by faulty hardware, or other known causes, and were eliminated by repair operations.

The short trials undertaken indicate an ECC hit rate of about zero. Of course, if the computer ran for a long time, such as several years, unexplained ECCs would, in fact, be expected. Nevertheless, even if some ECC hits occur over a long time, that fact is consistent with an ECC rate of substantially zero per day. For example, if one ECC hit occurred every ten years, that corresponds to an ECC hit rate of once in 3,650 days, or ⅟3,650 per day, or 0.0003 per day, which is substantially zero.

Therefore, the invention is viewed as providing an ECC hit rate for 20 modules, each containing 256 MB of memory, of significantly less than 1.0 hit per day, and substantially equal to zero hits per day.

Alternate Embodiment

Figure 19A:
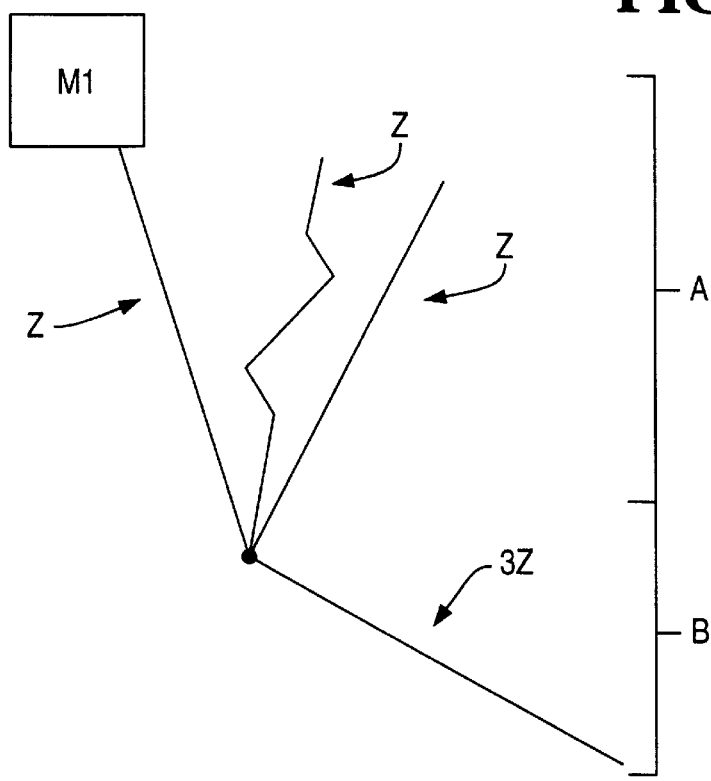
Figure 19B:
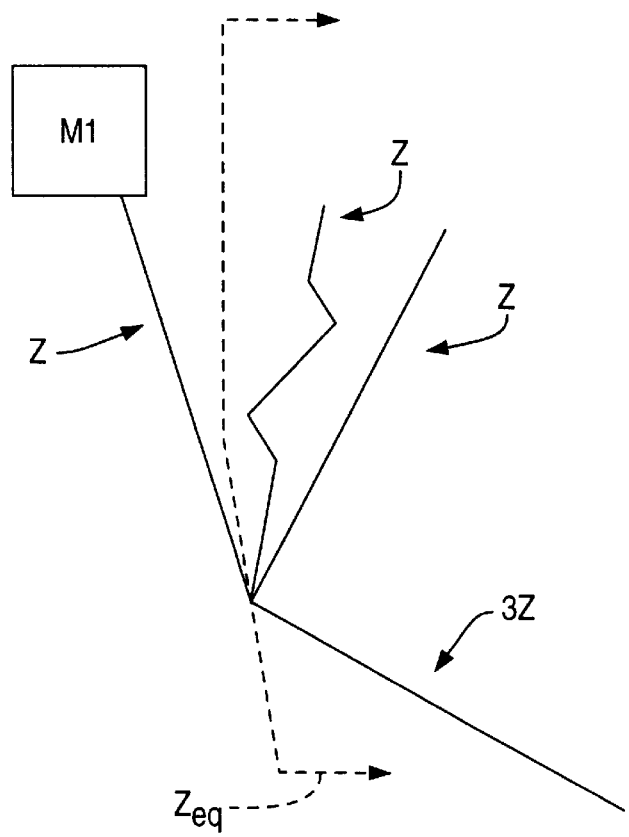

It was assumed above that, in FIG. 1, lines A, B, and C had equal characteristic impedances, Z. However, in FIG. 19, the characteristic impedance of line B is greater than that of lines A, and is indicated as 3Z, for simplicity. Under this condition, the equivalent impedance $Z_{eq}$, shown in FIG. 19B, is computed according to the following expression:

$$1/Z_{eq}=1/3Z+1/Z+1/Z=7/3Z$$

$Z_{eq}$ thus equals 3Z/7.

When this value is substituted into the reflection coefficient formula, given in FIG. 14, the result is $$R=(3Z/7-Z)/(3Z/7+Z)=-4/10.$$

The reflection coefficient has been reduced from negative one-half, as discussed above in connection with FIG. 16, to negative 0.4. Pulses 53 and 66 in FIG. 17 will thus be smaller.

Therefore, in one embodiment, lines A, B, and C need not be equal in impedance. The impedance of lines B may be greater than that for lines A. The impedance of line C may be greater than that for lines B. Preferred characteristic impedances for lines A, B, and C in FIG. 11 are 40, 65, and 95 ohms, respectively.

Additional Embodiment

FIGS. 20A through 20C show three layers 100, 110, 115, and 120 of a multi-layer printed circuit board. Layer 100 contains the modules M1–M9. Each module contains three control pins, as indicated. RAS means "row address select," as above. CAS means "column address select." WE means "write enable." Layers 110, 115, and 120 carry transmission line networks of the type shown in FIG. 6.

The network of layer 110 carries RAS pulses to each module M, as indicated. The network of layer 115 carries CAS pulses to each module M, as indicated. The network of layer 120 carries WE pulses to each module M, as indicated. Each network, of layer 110, 115, and 120, connect to a respective RAS PAD, CAS PAD, or WE PAD, shown on layer 100. These PADS take the form of edge-card connectors, or equivalent card connectors.

As layer 125 indicates, the address busses and the data busses do not contain the branching of layers 110, 115, and 120. These busses are normal, prior-art busses.

Additional Considerations

1. As stated above, the invention can be used in memory expansion cards for computers. These cards are typically constructed using printed circuit boards (PCBs). The transmission lines, such as lines A, B, and C in FIG. 11, are typically 0.004 to 0.010 inches wide, and have a capacitance of about 2 or 3 pico-Farads (pF) per inch. The input capacitance of the control pins of modules M is typically about 7 pF. The overall size of the PCB is about 2×6 inches. Each PCB can carry 256 Mega-bytes of memory.

The address bus and the data bus carried by the PCB are not branched, as indicated by layer 125 in FIG. 20C. Normal, prior-art busses are used.

2. The discussion above has been framed in terms of positive RAS pulses, for convenience. Negative pulses may also be used, and are sometimes preferred.

3. FIG. 18 shows nine modules M, and three groups of lines A feeding the modules. (Line A1 is shown as serpentine, to equal the length of line A2.) It is not necessary that the A-lines be grouped into groups of equal numbers. For example, module M9 could be eliminated, leaving three A-lines branching from junction J1, three lines branching from junction J2, and two lines branching from junction J3. Since equal groupings are not possible, non-equal groupings are tolerated.

However, it is preferred that the grouping attain, or at least approach, equality, if possible. For example, it is not preferred that, in FIG. 18, the branch to M7 originate at junction J2. In such a case, junction J2 would feed four branches, while junction J3 would feed two branches. This inequality can be eliminated, and the elimination is preferred.

Numerous substitutions and modifications can be undertaken without departing from the true spirit and scope of the invention. What is desired to be secured by Letters Patent is the invention as defined in the following claims.

What is claimed is:

1. An integrated circuit (IC) transmission line comprising:
a plurality of transmission line segments; and
at least one junction point to couple the plurality of transmission line segments, the plurality of transmission line segments and the at least one junction point comprising a predetermined topology wherein lengths of the plurality of transmission line segments are relative to a transition wavelength of a waveform in the IC transmission line, wherein the transition wavelength equals one of a rise time and a fall time of the waveform, times a propagation velocity of the waveform in the IC transmission line, times a constant of proportionality.

2. The IC transmission line of claim 1 wherein the predetermined topology comprises a star topology.

3. The IC transmission line of claim 2 wherein the plurality of transmission line segments comprise a plurality of legs and a trunk, and the at least one junction point comprises a unitary junction point, the unitary junction point to couple to the plurality of legs and the trunk.

4. The IC transmission line of claim 3 wherein the plurality of legs are substantially equal in length and substantially equal to one-tenth the transition wavelength.

5. The IC transmission line of claim 3 wherein the trunk is substantially equal to the transition wavelength.

6. The IC transmission line of claim 3 wherein the plurality of legs are less than one-fifth of the transition wavelength.

7. The IC transmission line of claim 3 wherein the trunk is less than one-fifth the transition wavelength and the plurality of legs are greater than the transition wavelength.

8. The IC transmission line of claim 1 wherein the predetermined topology comprises a crow foot topology.

9. The IC transmission line of claim 8 wherein the plurality of transmission line segments comprise a trunk, a plurality of B legs, and a plurality of A legs, and wherein the at least one junction point comprises a primary junction point and a plurality of secondary junction points, the primary junction point to couple to the trunk and the plurality of B legs, and each secondary junction point to couple to one of the plurality of B legs and at least two of the plurality of A legs.

10. The IC transmission line of claim 9 wherein the plurality of A legs are less than one transition wavelength, and the plurality of B legs and the trunk are less than one-half the transition wavelength.

11. The IC transmission line of claim 9 wherein the plurality of A legs, the plurality of B legs, and the trunk are substantially equal in length and substantially equal to one-quarter the transition wavelength.

12. The IC transmission line of claim 9 wherein an impedance of the trunk is greater than an impedance of each of the plurality of B legs, and the impedance of each of the plurality of B legs is greater than an impedance of each of the plurality of A legs.

13. A printed circuit board comprising:
a first layer; and
a second layer, each of the first and second layers comprising an integrated circuit (IC) transmission line comprising
a plurality of transmission line segments, and
at least one junction point to couple the plurality of transmission line segments, the plurality of transmission line segments and the at least one junction point comprising a predetermined topology wherein lengths of the plurality of transmission line segments are relative to a transition wavelength of a waveform in the IC transmission line, wherein the transition wavelength equals one of a rise time and a fall time of the waveform, times a propagation velocity of the waveform in the IC transmission line, times a constant of proportionality.

14. A method for designing an integrated circuit (IC) transmission line comprising:
coupling a plurality of transmission line segments to at least one junction point according to a predetermined topology; and
adjusting lengths of the plurality of transmission line segments relative to a transition wavelength of a waveform in the IC transmission line, wherein the transition wavelength equals one of a rise time and a fall time of the waveform, times a propagation velocity of the waveform in the IC transmission line, times a constant of proportionality.

* * * * *